United States Patent [19]

Sauer et al.

[11] 4,453,112
[45] Jun. 5, 1984

[54] ELECTRONIC SAFETY DEVICE FOR CONTROLLING THE DRIVE MOTOR ATTACHED TO A SLIDING WINDOW

[75] Inventors: Gerd Sauer, Stolberg-Venwegen; Dieter Unbehaun, Nuremberg, both of Fed. Rep. of Germany

[73] Assignee: Saint-Gobain Vitrage, Courbevoie, France

[21] Appl. No.: 362,040

[22] Filed: Mar. 25, 1982

[30] Foreign Application Priority Data

Mar. 25, 1981 [DE] Fed. Rep. of Germany ....... 3111684

[51] Int. Cl.³ .............................................. G05D 3/00
[52] U.S. Cl. ................................... 318/281; 307/116; 324/61 R; 318/282; 318/333; 318/467; 200/61.43
[58] Field of Search ................ 324/60 R, 61 R, 61 P; 318/266, 333, 281, 282, 447, 450, 452, 453, 466, 478, 467, 456, 458, 490, 483; 200/61.41, 61.42, 61.43, 61.44, DIG. 1; 49/26–28; 307/116, 127; 301/181

[56] References Cited

U.S. PATENT DOCUMENTS

| | | | |
|---|---|---|---|
| 3,651,389 | 3/1972 | Ito et al. | 318/466 |
| 3,689,814 | 9/1972 | Holt | 318/266 |
| 3,725,748 | 4/1973 | Atkins | 361/181 |
| 3,761,736 | 9/1973 | Edge et al. | 200/DIG. 1 |
| 3,868,626 | 2/1975 | Masher | 340/38 L |
| 3,927,336 | 12/1975 | Carlson et al. | 361/181 |
| 4,016,490 | 4/1977 | Weckenmann et al. | 324/61 P |
| 4,119,864 | 10/1978 | Petrizio | 361/181 |
| 4,175,239 | 11/1979 | Sandler | 361/181 |
| 4,272,708 | 6/1981 | Carle et al. | 318/466 |
| 4,309,663 | 1/1982 | Bout et al. | 328/132 |
| 4,351,016 | 9/1982 | Felbinger | 318/266 |

Primary Examiner—G. Z. Rubinson
Assistant Examiner—A. Evans
Attorney, Agent, or Firm—Pennie & Edmonds

[57] ABSTRACT

Apparatus for an electrically moved sliding window used in automotive applications, having a built-in safety device is described. This detector is a proximity detector which detects the approach of a portion of a human body, e.g. a gloved hand. This detector is advantageously comprised of a capacitive pickup carried along the upper edges of the window, connected to a detector stage which, as a function of the rate of change in the signal appearing across the pickup, acts, via an amplifier, to remove the electrical power supplied to the drive motor of the window.

13 Claims, 10 Drawing Figures

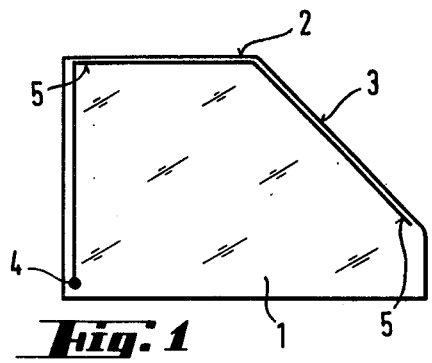
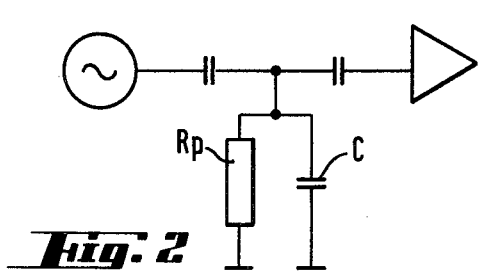
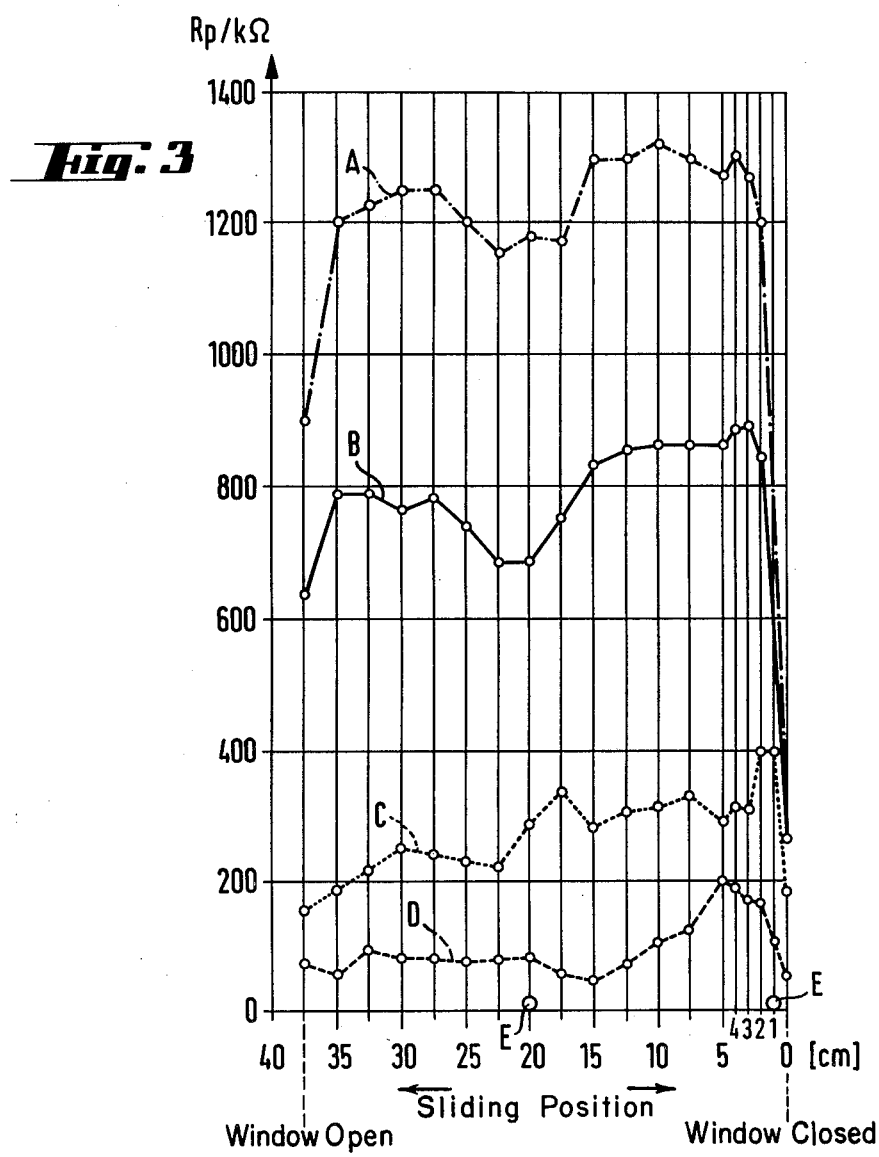

ELECTRONIC SAFETY DEVICE FOR CONTROLLING THE DRIVE MOTOR ATTACHED TO A SLIDING WINDOW

BACKGROUND OF THE INVENTION

1. Field of the Invention

The invention relates to an electronic control circuit for use as a safety device for controlling the motion produced by a drive motor which is employed to raise and lower a sliding window and, in particular, an automotive window.

2. Description of the Prior Art

A safety detector, i.e., proximity detector, for use in an automotive electrically operated sliding window, as described, for example, in U.S. Pat. No. 3,651,389, comprises a conductor used as a capacitive pickup and oriented along the upper edge of the window. Capacitance of the pickup varies whenever a portion of a human body, e.g., hand, approaches it. The pickup is connected to an oscillator which, in turn, is connected to a detector contained within a control circuit. As the capacitance of the pickup varies, the amplitude of the signal produced by the oscillator and appearing across the pickup also varies. This detector is comprised of an amplifier, which in response to changes in the amplitude of the signal appearing across the pickup, causes the power applied to a motor, which raises and lowers the window, to be cut off.

Such a safety detector should prevent the window from moving when the pickup is in direct contact with a portion of a human body, e.g., a hand. However, to be totally effective, the detector must always prevent the window from moving whenever a nonconductive contact occurs; for example, when a gloved hand touches the window. The detector should, therefore, respond to a small change in the capacitance of the pickup and, therefore, must have a relatively high sensitivity. However, whenever the detector is set to such a high sensitivity, the control circuit often reacts to certain spurious influences, i.e., changes imparted to the signal which are totally unrelated to the approach of a part of the body to the capacitive pickup.

These changes occur, for example, when a moisture deposit appears on the glass, either in the form of mist or water film, or even as the result of a salt deposit. In addition, spurious influences also occur whenever the pickup approaches the window frame, or if the respective positions of various elements of the circuit change during movement of the window or, lastly, if these elements encounter considerable temperature variations.

SUMMARY OF THE INVENTION

Accordingly, it is an object of the present invention to provide an arrangement for a safety device for an electrically driven sliding window which eliminates the generation of spurious signals.

This and other objects are achieved in accordance with the invention by detecting the rate of change per unit time of any variations in the signal appearing across the capacitive pickup. By so doing, the likelihood that the window will be moved in response to any spurious signals is substantially reduced.

Specifically, this invention recognizes that signals associated with spurious influences, for example, humidifying of the glass, do not cause any sudden disturbance, but rather cause variations that are clearly slower than the signals resulting from the desired condition, i.e., the approach of a hand or other part of the body.

In accordance with a specific embodiment disclosed herein, the sensitivity of the detector is modified whenever a variation in the signal appearing across the pickup lasts for a sufficiently long period of time. This period of time is such that the relationship between the variations in the detected signal, appearing before and after this time has elapsed, correspond to characteristics which are associated with the approach of a portion of an individual's body.

Specifically, the gain or sensitivity of the detector is first set to a minimum value. If the damping, imparted by the pickup to the signal appearing across it, reaches a certain threshold while the window glass is being closed, then the control circuit stops the drive motor and at the same time switches to a higher sensitivity. The detector then verifies, after a given interval of time—illustratively from 0.1 to 0.5 seconds—has elapsed, that the damping has reached a value corresponding to the new sensitivity. If, on the one hand, the new threshold is not reached, then the slope of the signal appearing across the pickup is less steep than that associated with the approach of a body portion. In this case, the control circuit causes power to be applied to the drive motor to continue closing the window. After a longer time interval, for example, 3 seconds, has elapsed, the detecting circuit assumes its initial sensitivity. However, if, on the other hand, the new threshold is exceeded, this means that the signal exhibits a high slope due to the approach of a portion of a human's body. As a consequence, the detector causes the power applied to drive motor to remain off. Advantageously, the gain increase occurs in several stages. This not only effectively neutralizes the change in the damping exerted by the pickup resulting from the approach of the edge of the window to the metal frame, but also ensures that the detector will have sufficient sensitivity to detect the approach or presence of a part of the body.

In accordance with an aspect of this invention, as the window approaches its end of travel in the fully closed position, it closes in a step-by-step or incremental fashion. When an end contact is made, thereby signifying that the fully closed position is reached, the control circuit removes power applied to drive motor, thereby preventing any further movement of the window beyond its end of travel point.

BRIEF DESCRIPTION OF THE DRAWING

The invention may be clearly understood from a consideration of the following detailed description and accompanying drawing in which:

FIG. 1 depicts a full view of a sliding window intended for use in an automobile and which is equipped with an electrically conductive strip acting as the capacitive pickup for the safety detector;

FIG. 2 is a diagram of the detector and equivalent circuit of the pickup;

FIG. 3 graphically depicts the change in the value under various conditions, of the resistance of the pickup $R_p$—shown in FIG. 1—as a function of the position of the window in the window opening;

DETAILED DESCRIPTION

Figure 4:
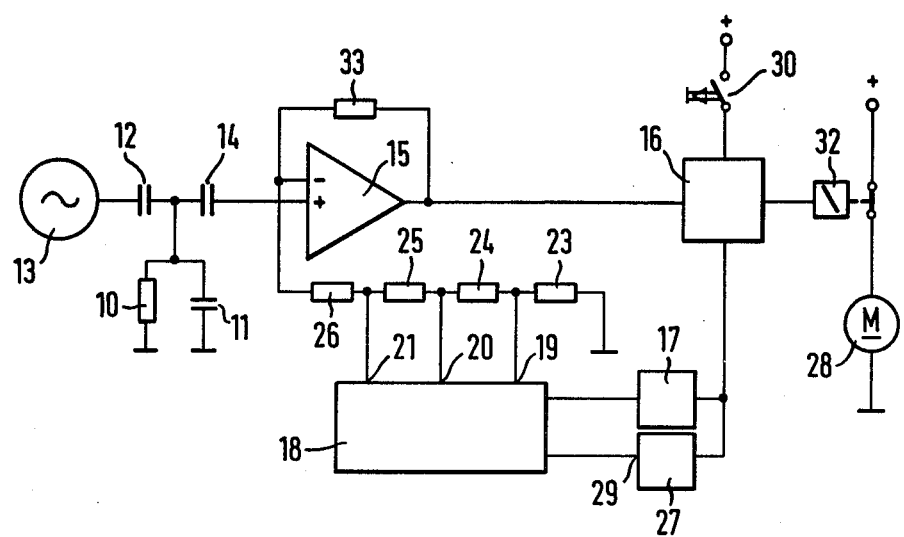
FIG. 4 is a schematic diagram of the control circuit which, according to the principles of the present invention, has a variable sensitivity.

FIG. 1 depicts a full view of glass 1 which is particularly intended to be used as a vehicular window housed within a door of an automobile. Pickup 5 constitutes an important element of the safety circuit used to control a drive motor (not shown) which raises and lowers glass 1. This pickup is illustratively comprised of an electroconductive line 5 placed on this glass along upper edge 2 and oblique front edge 3. This pickup is fed from a point 4 and changes its capacitance whenever a part of a human body, for example, a gloved hand, is brought into the proximate vicinity of the pickup.

The detection stage, as shown in FIG. 2, contains an oscillator which is connected to the pickup. Pickup 5 can be represented by an equivalent circuit having a capacitor C connected in parallel with a resistance $R_p$. The values of the capacitance and resistance of capacitance C and resistor $R_p$ change whenever a part of the body comes in the immediate vicinity or proximity of the pickup, with the variation in the value of the resistance being predominant. The magnitude of these values depend upon various other factors, such as: the length of the conductive line used to implement pickup 5, the shape of the window glass, construction of the window frame (not shown) in which the window slides, and any humidity buildup on the surface of the glass of the window. These values also vary as a function of the height of the glass relative to the window opening.

Specifically, FIG. 3 shows the variation in the value of resistance of the resistor $R_p$ under various typical conditions. The value of this resistance was measured for a 95 cm length pickup attached the the inside of the left front window of a Mercedes W123 type automobile and having an oscillation frequency of 250 kHz applied to the pickup.

Curve A shows the variation of resistance for dry window glass, as a function of its height. When the window is fully open $R_p$ has a value on the order of 900K ohm. This value increases to approximately 1300K ohm as the glass is raised and then drops suddenly to about 200K ohm as the pickup approaches the upper part of the frame.

Curve B shows the variation in resistance caused by contact with a body portion, e.g. a hand within a glove on the upper edge, in each of the positions of a dry window glass. It can be readily seen that as long as the window is at least partially opened, the value of $R_p$ is about 400K ohm lower than that of dry glass alone, as shown by curve A. To achieve reliable information, tests were made by repetitively placing an artificial hand with constant electrical characteristics on the upper edge of the glass.

Curve C shows the variation of resistance of resistor $R_p$ for the same glass substantially covered with a heavy mist deposit. It can be readily seen that the value of $R_p$ is strongly influenced by moisture.

A still greater drop in the resistance of resistor $R_p$ occurs if the window glass is very wet. Resistances measured in this case correspond to curve D, which shows that, under these conditions, the resistance reaches, on the average, a value of approximately 100K ohm. Furthermore, if a body portion, illustratively a hand, touches the upper edge of a wet window, the resistance value drops practically to zero as shown by point E.

To eliminate any adverse effects, caused by, for example, a moisture deposit on the window glass, from adversely affecting the response of the control circuit, the detector, in accordance with the teachings of the present invention, does not use the absolute value of the signal provided by pickup 5, but instead utilizes the rate of change in the signal. Rate, instead of magnitude, information is utilized because the changes caused by the above adverse affects are small and, more particularly, normally do not exceed a value on the order of 1% per second. By contrast, the changes in the signal, appearing across the pickup caused by the approach of a body portion, are significantly greater.

FIG. 4 shows a schematic diagram of a control circuit in which the detector has a fixed threshold and a variable gain, wherein, more particularly, the gain progressively increases by the progressive elimination of various resistances in the detector as the control threshold is exceeded. Pickup 5, represented in the form of the equivalent diagram, comprises resistor 10 and capacitor 11. Pickup 5 is connected by coupling capacitor 12 to oscillator 13. The oscillator produces a sinusoidal wave at approximately 250 kHz. The voltage supplied by the oscillator depends on the amount of damping produced by pickup 5, i.e., by the magnitude of the resistance of resistor 10 and the capacitance of capacitor 11, and exerted on the output signal of the oscillator. The voltage appearing across the pickup is then, in turn, applied by coupling capacitor 14 to amplifier 15.

The output of amplifier 15 is applied to a control stage 16. This stage, in turn, feeds a time relay 17 and a power relay 32. The output of time relay 17 is, in turn, applied to the input of the counter 18. Outputs 19, 20 and 21 of the counter are shunted between potentiometric resistances 23, 24 and 25 of a negative feedback loop connected to the negative terminal of the amplifier. If an attenuated or weak signal, appearing across the pickup, is applied to the positive terminal of the amplifier, then, in response thereto, control stage 16 locks one of its outputs in a fixed state. This causes power relay 32 to remove the power from the motor, thereby stopping its motion. In the event that the weak or attenuated signal lasts for a certain period of time, at least 0.5 second, then the gain of amplifier 15 increases. Specifically, 0.5 seconds after control stage 16 locks its output, relay 17 changes its state, thereby causing counter 18 to advance one position. This, in turn, applies a low level or ground signal to output 19, which effectively short-circuits resistance 23. This thus increases the gain of amplifier 15. If the weak signal appearing at the positive input of the amplifier remains for another 0.5 seconds, then relay 17 causes the counter to again increment its contents. This effectively grounds output 20 of counter 18, which in turns short-circuits resistance 24. This raises the gain of the amplifier even further. If the weak signal remains for a further half-second, then the counter is again advanced and, in turn, output 21 is also grounded which effectively short-circuits resistance 25. This raises the gain of the amplifier even further.

However, as soon as the input signal appearing across the pickup increases in amplitude, the status of control stage 16 reverts to its initial state and counter 18 stops counting. Time relay 27 is then activated and after 3 seconds, its output 29 applies a reset pulse to counter 18 which in turn removes the low voltage appearing at outputs 19 through 21. This in turn places resistances 23, 24 and 25 back into the negative feedback loop around amplifier 15. Consequently, the gain of the amplifier decreases such that the sensitivity of the amplifier returns to its initial value. Motor 28, which moves the window, only starts when control stage 16 which drives power relay 32, receives a starting pulse from contactor 30—which is energized by a manual pushbutton which is pushed by a human to raise or lower the window.

An illustrative list of components for the circuit shown in FIG. 4 which will product the above-described operation, is listed in Table 1 below.

TABLE I

| capacitor 12 | 30 pF |
| capacitor 14 | 30 pF |
| resistance 33 | 1 M ohm |
| resistance 26 | 1 k ohm |
| resistance 25 | 50 ohm |
| resistance 24 | 50 ohm |
| resistance 23 | 50 ohm |
| amplifier 15 | type 741 |
| counter 18 | type 7490 |
| delay element 17 | type 555 |
| delay element 27 | type 555 |

Figure 5:
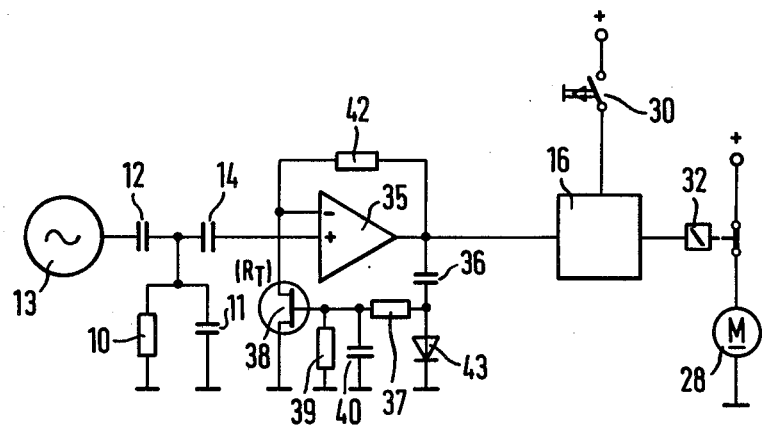
FIG. 5 is a schematic diagram of a control circuit, according to the teachings of the present invention, which has a continuously variable threshold.

In the circuit shown in FIG. 5, the degree of damping caused by the pickup and exerted onto the signal produced by the oscillator, as previously discussed, modifies, as in the circuit shown in FIG. 4, the voltage delivered through coupling capacitor 14 to the positive input of amplifier 35. However, as the damping, caused by the approach of a body portion to the pickup, increases, then the voltage applied to the input of the amplifier diminishes. Simultaneously therewith amplifier 35 continuously lowers the detector's input threshold and, as such, increases the sensitivity of the amplifier. To achieve this, the output voltage produced by the amplifier and fed to control stage 16, is applied through capacitor 36 and resistance 37 to the gate of field-effect transistor 38. This, in turn, causes the transistor to conduct which effectively grounds the negative terminal of the amplifier. As the drain/source resistance Rt of transistor 38 decreases to a very low value, as the transistor starts conducting, the gain of the amplifier concurrently increases, thereby increasing the sensitivity of the detector to changes in the voltages appearing across the pickup.

The time constant associated with this increase, i.e. the rate of the increase, in sensitivity or gain permits the circuit to distinguish a spurious signal from a desired signal, i.e., that caused by the approach of a body portion to the window. This time constant is established by resistance 39 and capacitor 40. Preferably, it is set to provide a damping variation on the order of approximately 5% per second. To achieve this, the values of resistance 39 is set to approximately 1M ohm and that of capacitor 40 is set to 10 $\mu$F.

The time constant of the redescent of the adjustment of the amplifier, i.e., the time interval that passes after a desired signal occurs until the amplifier regains its initial sensitivity, should be set as short as possible so that the circuitry will regain its initial sensitivity as quickly as possible. Tests showed that it is advantageous to set this constant to approximately 10% of the time constant associated with the gain increase.

To implement these operations, the other elements of the circuit, above and beyond those shown in FIG. 4, can have the following illustrative values as shown in Table 2 below.

TABLE II

| capacitor 12 | 10 pF |
| capacitor 14 | 10 pF |
| capacitor 36 | 100 nF |
| resistance 37 | 100 k ohm |
| resistance 42 | 1 M ohm |
| diode 43 | type 1 N 4148 |
| amplifier 45 | type 741 |
| field-effect transistor 38 | type BF 245 |

Figure 6:
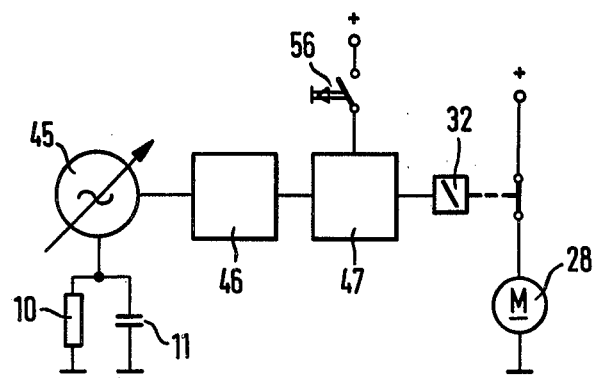
FIG. 6 is a block diagram of a control circuit having a digital transcriber.
Figure 7:
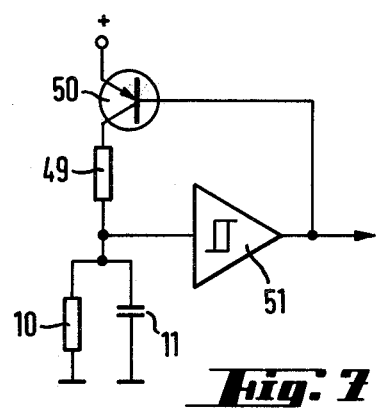
FIG. 7 depicts, in schematic form, the construction of the variable frequency oscillator of the control circuit, shown in FIG. 5.
Figure 8:
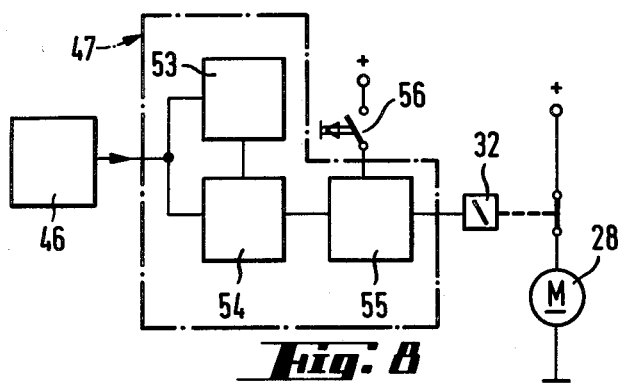
FIG. 8 is a block diagram of the power stage of the control circuit shown in FIG. 5.

FIGS. 6, 7 and 8 depict, in block diagram form, a control circuit, according to the teachings of the present invention, which digitally processes the signal appearing across the pickup. As shown in FIG. 6, the pickup, again represented by resistor 10 and capacitor 11, provides an input signal to variable frequency oscillator 45. The frequency of the output produced by oscillator 45 and appearing across the pickup is measured in counter 46 and is applied to transcriber 47—to be discussed shortly—which in turn supplies a signal to driving relay 32 for control of window drive motor 28.

The construction of variable frequency oscillator 45 is shown, by way of example, in FIG. 7. The oscillator comprises the pickup (shown here as being equivalent to resistor 10 and capacitor 11), resistance 49, transistor 50 and voltage comparator 51. Initially, i.e., when the oscillator is started, the output of comparator 51 is at zero potential and transistor 50 conducts. Capacitor 11 thus charges through resistance 49. When the input signal, applied to the positive input terminal of comparator 51 reaches a certain threshold, then the output of this comparator switches to illustratively a a high voltage, i.e., a +1 state, and transistor 50 stops conducting. At that point, capacitor 11 gradually discharges through resistor 10 until the voltage appearing across this capacitor reaches a lower threshold (determined by the amount of hysteresis in comparator 51), at which the comparator's output switches to a low voltage, or zero potential. A new charging cycle then begins. Since contact with the pickup by, for example, a portion of an individual's body, lowers the capacitance of capacitor 11, its charging and discharging period decreases, which, in turn raises the frequency of the voltage obtained at the output of voltage comparator 51.

As shown in detail in FIG. 8, transcriber 47 comprises storage register 53, subtractor 54 and driving control stage 55. The output of counter 46 is applied to both subtractor 54 and register 53, wherein it is first stored. Once the contents of the counter have been stored in register 53, they are subtracted from the most recently stored value in subtractor 54. The result of this subtraction gives the frequency variation of the oscillator, which serves as the detected change information. If the result is zero, there is no variation in functioning of the oscillator; however, if it is negative, the frequency increases. Beyond a certain threshold, which illustratively corresponds to a rate of change in the frequency on the order of 5% per second, control stage 55 causes one of its outputs to assume a constant state. This in turn activates power relay 32, which in response thereto cuts off the power to motor 28. The motor is re-energized as soon as control stage 55 receives a new starting pulse from contactor 56—which is energized by a manual switch which a human appropriately pushes to raise or lower the window.

Transcriber 47 advantageously constitutes a sequential logic circuit. However, even in the simplest case, this circuit is relatively complex. Therefore, it is advantageous to implement transcriber 47 through a microprocessor. The latter cannot only perform both the logic and control processes, but can, moreover, due to its inherent sophistication, considerably increase the detection possibilities. Illustratively, the microprocessor can be programmed to (a) take the static value of the signal occurring across the pickup into account by, for example, setting the detection threshold of the amplifier as a function of the absolute value of the signal, or (b) create a detection range or a characteristic function from which the control of the motor can be performed.

Figure 9:
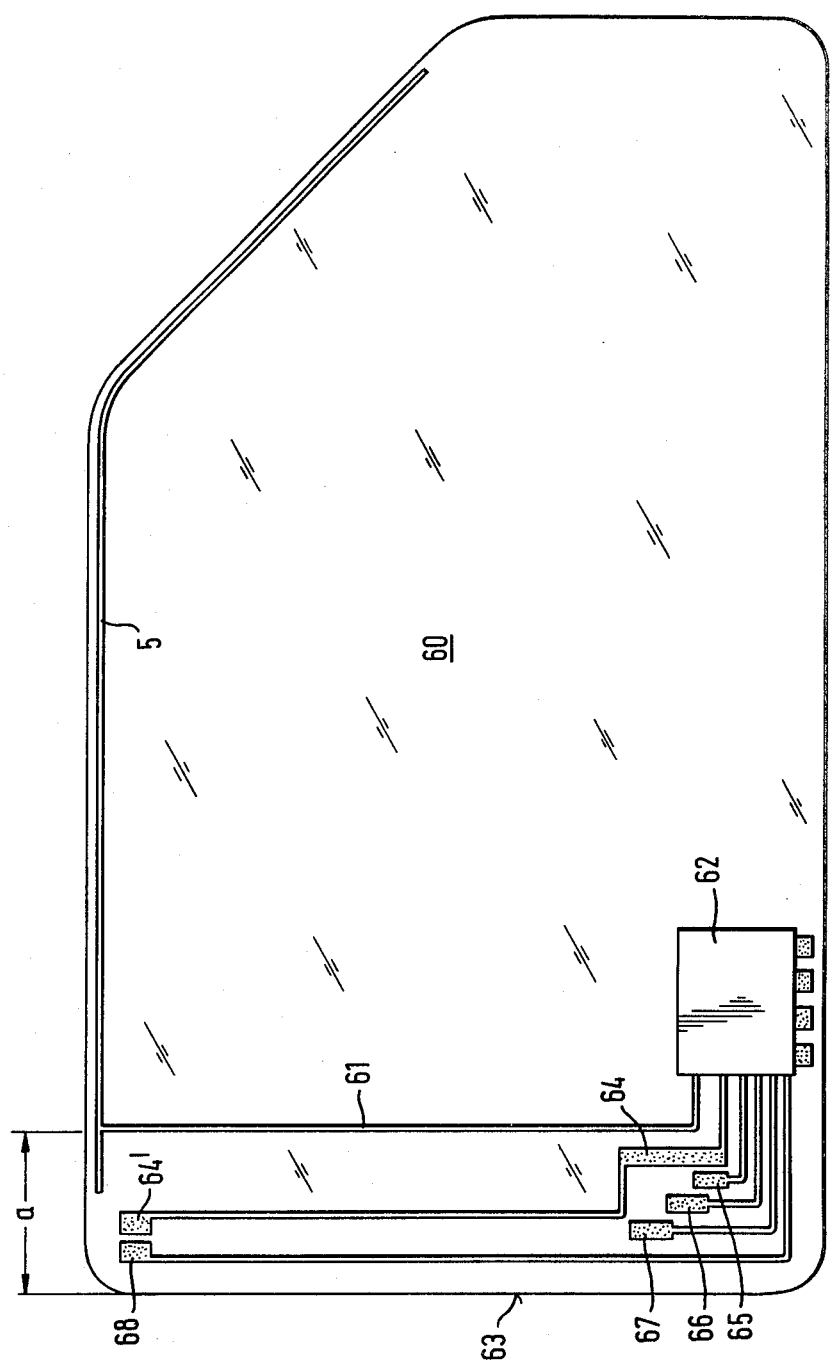
FIG. 9 shows a full view of a glass which carries various auxiliary switching lines having contact areas which provide position information to the control circuit and modify its sensitivity in given positions.

As shown in FIG. 9, all the circuits described thus far can be interconnected by using switching lines which have contact areas, the latter permit the sensitivity of the amplifier to be modified as a function of the position of the glass in the window opening. The switching lines necessary for this purpose can be placed on the glass, in, more particularly, its side zone. The contact areas successively make electrical contact with a sliding conductive post and stud placed in the window frame. Thus, by varying the sensitivity, these switching lines can be useful to mitigate the sudden drop of the value of the resistance of the pickup as the upper edge of the window approaches the window frame.

Specifically, in the embodiment of the window depicted in FIG. 9, glass 60 is equipped with a plurality of auxiliary switching lines located near the left side edge. Connecting line 61 connects pickup 5 to the electronic circuit which includes the detector. This circuit is shown here in the form of a integrated circuit 62 fastened directly onto glass 63. Connecting line 61 is oriented at a distance A inward from vertical edge 63 of the glass to reduce spurious signals. For further information regarding the placement of these lines, the reader is referred to our co-pending patent application Ser. No. 361,414, filed Mar., 24, 1982, entitled "Electrically Moved Sliding Window Provided With a Safety Detector" is incorporated by reference herein. Five conductive strips, all connected to control circuit 62 are positioned in the area or region between vertical edge 63 and connecting line 61. Enlarged contact areas 64, 64', 65, 66 and 67 are appropriately located in sites where they can be connected together by a sliding conductive post or stud located in the window frame. The conductive lines are covered with an insulating layer that leaves only these contact areas bare.

Figure 10:
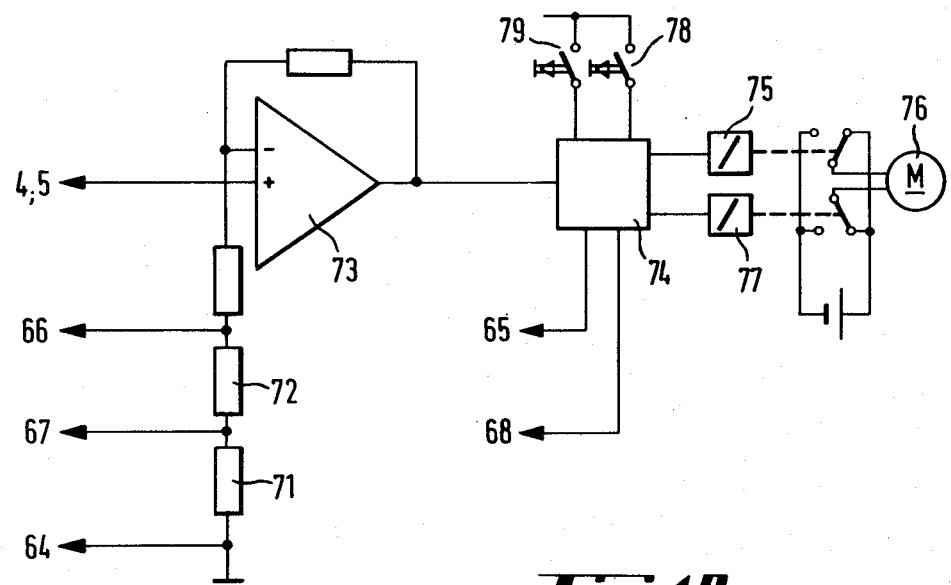
FIG. 10 is a block diagram of another embodiment of a control circuit which varies its sensitivity according to the position of the window.

For the embodiment shown in FIG. 9, contact area 64 and 67 are connected by the conductive post when the upper edge of the window is positioned approximately 3 cm from the top edge of the window frame (not shown). As shown diagrammatically in FIG. 10, resistor 71 is thus short-circuited. This increases the gain of amplifier 73 and in turn compensates for the drop of resistance of the pickup caused by its approach to the window frame. As successive resistances are short-circuited, as previously discussed, the amplifier's gain gradually increases. For example, when contact area 66 reaches the sliding stud, resistance 72 is short-circuited, which, in turn, causes the gain of the detector to increase. As long as the gain increases and, correspondingly, the detection threshold decreases, power is applied to motor 76 to continue closing the window.

When the glass reaches its completely closed position, contact area 65 reaches the conductive stud. It acts directly on control stage 74 to cut off, via relay 75, the power applied to motor 76, Manual contactor 78, energized by a manual pushbutton—as previously described—controls the lowering of the window and acts directly on control stage 74. With the window in the fully closed position, the detector is disabled. Alternatively, when the window reaches its fully opened position, contact area 68 acts directly on control stage 74, which in response thereto opens relay 77 in order to cut off power applied to motor 76. Thus, the window remains in the completely open position. Manual contactor 79—also energized by a manual pushbuttom—causes control stage 74 to apply power to motor 76 which, in turn, causes the window to go up. Simultaneously therewith, the detector is enabled.

Thus, many and varied arrangements incorporating the teachings of the present invention may be devised by those skilled in the art without departing from the spirit and scope of the invention.

What is claimed is:

1. An electrically operated sliding window equipped with a safety device which prevents the window from moving whenever a portion of a human body approaches the window, said safety device comprising:
    a capacitive pickup oriented along an upper edge of said window,
    an oscillator producing an output signal which is applied to said pickup and is responsive to the approach of said body portion, and
    a detector, having an input sensitivity and responsive to a signal appearing across said pickup, for ascertaining the approach of said body portion to said window as a function of whether the rate-of-change of said signal exceeds a pre-selected threshold value during a finite interval of time during which the input sensitivity is successively increased throughout a plurality of pre-defined values so as to minimize any spurious effects and erratic operation of the window.

2. An electrically operated sliding window equipped with a safety device which prevents the window from moving whenever a portion of a human body approaches the window, said safety device comprising:
    a capacitive pickup directed along an upper edge of said window,
    an oscillator producing an output signal which is applied to said pickup and is responsive to the approach of said body portion, and
    a detector having a sensitivity and being responsive to signals appearing across said pickup for ascertaining the rate of change in said output signal and for determining, as a function of the rate, whether said body portion approaches said window, wherein the sensitivity of the detector is varied in response to the rate and said detector comprises a voltage comparator and at least one resistance element connected to said comparator which, when electrically connected to or short-circuited around the comparator, modifies the sensitivity of the detector from an initial value, and a time delay which, after an interval of time has elapsed, monitors the output of the comparator and disconnects the resistance element as long as the output of the comparator has not changed during that interval.

3. The invention in claim 2 in which the sensitivity is successively varied at intervals of 0.1 to 0.5 seconds.

4. The invention in claims 2 or 3 in which the detector further comprises a second time relay which, after an increased sensitivity has been established, applies power to a drive motor which moves said window, and after an interval of time greater than 1 to 3 seconds, reconnects said resistance elements to restore the initial sensitivity value.

5. The invention in claim 2 in which the detector further comprises a negative feedback amplifier provided with a field-effect transistor having a drain/source resistance, which continuously diminishes as the damping created by the pickup increases and which thus equalizes the output voltage of the amplifier, and having a time constant which in regard to damping increase causes the threshold to be reached by the signal appearing across the pickup only if it exceeds a predetermined rate of change.

6. The invention in claim 5 in which the detector has an associated time constant which is set to a predetermined value such that the output signal of the detector is able to follow the increases in the signal appearing across said pickup as long as these increases are less than 10% per second.

7. The invention in claim 6 wherein the detector is further comprised of means for desensitizing the control circuit and means for providing a time constant that eliminates damping reductions up to 50% per second and preferably up to 100% per second.

8. The invention in claim 2 in which the detector further comprises a variable frequency oscillator which varies its frequency as a function of the change in the signal appearing across the pickup, a counter to measure the frequency and a frequency comparator comprised of a storage register and a subtractor.

9. The invention in claim 8 in which the variable frequency oscillator further comprises a transistor and a voltage comparator, the latter having a predetermined amount of hysteresis.

10. The invention in claim 9 in which the window is further comprised of conducting lines and switching elements, placed on a surface of the window, the switching element being appropriately positioned to contact a sliding conductive contact placed in the window frame for modifying the sensitivity of the control circuit as a function of the positional height of the window in the window frame.

11. The invention in claim 1 in which said detector has a sensitivity which is varied in response to said ascertained rate.

12. The invention in claim 2 further comprised of means, operative in response to a detected change in said signal, for correspondingly varying the threshold value each time the sensitivity is increased during said interval.

13. The invention in claim 1 further comprised of means for correspondingly varying a threshold value each time the sensitivity is varied and for determining whether the rate-of-change continuously exceeds the varying threshold value.

* * * * *